US010381382B2

(12) United States Patent
Du

(10) Patent No.: US 10,381,382 B2
(45) Date of Patent: Aug. 13, 2019

(54) ARRAY SUBSTRATE, METHOD FOR MANUFACTURING THE SAME AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventor: Guochen Du, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/663,930

(22) Filed: Jul. 31, 2017

(65) Prior Publication Data
US 2018/0047752 A1 Feb. 15, 2018

(30) Foreign Application Priority Data
Aug. 15, 2016 (CN) .......................... 2016 1 0669155

(51) Int. Cl.
H01L 21/44 (2006.01)
H01L 27/12 (2006.01)
G02F 1/1368 (2006.01)
H01L 21/768 (2006.01)
H01L 29/40 (2006.01)

(52) U.S. Cl.
CPC .......... H01L 27/124 (2013.01); G02F 1/1368 (2013.01); H01L 21/76816 (2013.01)

(58) Field of Classification Search
CPC ........................ H01L 27/124; H01L 21/76816
USPC .................... 257/773–775; 438/98, 666–675
See application file for complete search history.

(56) References Cited

U.S. PATENT DOCUMENTS

| 9,373,649 B2 * | 6/2016 | Ning .................... H01L 27/1248 257/43 |
| 2008/0180613 A1 | 7/2008 | Matsumoto |
| 2016/0064415 A1 | 3/2016 | Zhan |
| 2017/0271370 A1 | 9/2017 | Wang et al. |
| 2018/0188574 A1 * | 7/2018 | Hu ........................ G02F 1/1368 |

FOREIGN PATENT DOCUMENTS

| CN | 101231406 A | 7/2008 |
| CN | 104332473 A | 2/2015 |
| CN | 104966721 A | 10/2015 |
| CN | 105161505 A | 12/2015 |

OTHER PUBLICATIONS

First Office Action for Chinese Application No. 201610669155.3, dated Sep. 21, 2018, 6 pages.

* cited by examiner

Primary Examiner — Calvin Lee
(74) Attorney, Agent, or Firm — Brooks Kushman P.C.

(57) ABSTRACT

An array substrate, a manufacture method thereof and a display device are provided. The array substrate includes a base, and multiple metal layers configured to be insulated from each other and arranged on the base, each of at least two metal layers of the multiple metal layers includes a common electrode line and the common electrode lines in the at least two metal layers are connected to each other.

20 Claims, 11 Drawing Sheets

ARRAY SUBSTRATE, METHOD FOR MANUFACTURING THE SAME AND DISPLAY DEVICE

CROSS-REFERENCE TO RELATED APPLICATION

This application claims a priority to a Chinese patent application No. 201610669155.3, filed in China on Aug. 15, 2016, which is incorporated herein by reference in its entirety.

TECHNICAL FIELD

The present disclosure relates to the field of display, and in particular, to an array substrate, a method for manufacturing the array substrate and a display device including the array substrate.

BACKGROUND

A liquid crystal display (LCD) includes a color film substrate and an array substrate that are oppositely arranged to form a cell, a liquid crystal layer filled between the color film substrate and the array substrate, peripheral circuits and a backlight assembly. The array substrate is formed by manufacturing a number of thin-film-transistor switches on a substrate of a specific size (such as a glass substrate) by means of coating, exposure, development, etching processes. The array substrate typically includes a number of display substrates (small substrates which may be obtained by cutting the array substrate) arranged according to different requirements on sizes. There are gaps between different ones of the display substrates, and these gaps are used to arrange various auxiliary structures, such as signal input lines, common electrodes, or the like. An aperture ratio refers to a ratio between an area of a portion through which light passes other than portions of each sub-pixel where wiring and transistors are arranged, and an area of the sub-pixel. The higher the aperture ratio is, the higher the efficiency of light transmission is, and the better the performance of the array substrate is.

In liquid crystal displays in related arts, since a common electrode line and a gate line are arranged in a same layer and there is a space between the common electrode line and the gate line, regions corresponding to the common electrode line, the gate line and the space may not display images, resulting in a low aperture ratio of the array substrate.

SUMMARY

In order to solve the problem that an array substrate has a low aperture ratio, an array substrate, a manufacture method thereof and a display device are provided in the present disclosure.

In a first aspect, an array substrate is provided in the present disclosure. The array substrate includes a base, and a plurality of metal layers configured to be insulated from each other and be arranged on the base, wherein each of at least two metal layers of the plurality of metal layers includes a common electrode line and the common electrode lines in the at least two metal layers are connected to each other.

Optionally, an insulating layer is arranged between every two adjacent metal layers in the at least two metal layers, and a via hole is formed in the insulating layer, and the common electrode lines in the at least two metal layers are connected to each other through the via hole.

Optionally, the at least two metal layers include a gate metal layer and a source/drain metal layer, the gate metal layer is arranged on the base and includes a first common electrode line; and a gate insulating layer is arranged on the gate metal layer, and a first via hole is formed in the gate insulating layer; and the source/drain metal layer is arranged on the gate insulating layer and includes a second common electrode line, and the second common electrode line is connected to the first common electrode line through the first via hole.

Optionally, an interlayer insulating layer is formed on the source/drain metal layer, and a second via hole is formed in the interlayer insulating layer; and the at least two metal layers further include a pixel electrode layer, the pixel electrode layer is arranged on the interlayer insulating layer and includes a third common electrode line, and the third common electrode line is connected to the second common electrode line through the second via hole.

Optionally, the at least two metal layers include a gate metal layer, a source/drain metal layer and a pixel electrode layer, the gate metal layer is arranged on the base and includes a first common electrode line; a gate insulating layer is arranged on the gate metal layer, and a first via hole is formed in the gate insulating layer; the source/drain metal layer is arranged on the gate insulating layer and includes a second common electrode line; an interlayer insulating layer is formed on the source/drain metal layer, a second via hole is formed in the interlayer insulating layer, the second via hole is intercommunicated with the first via hole, and an area of an opening of the second via hole is greater than that of an opening of the first via hole; and the pixel electrode layer is arranged on the interlayer insulating layer, the pixel electrode layer includes a third common electrode line, the third common electrode line is connected to the second common electrode line through the second via hole, and the third common electrode line is connected to the first common electrode line through the first via hole.

Optionally, there is an overlapped region between an orthographic projection of the second via hole on the base and an orthographic projection of the first via hole on the base.

Optionally, the gate metal layer further includes a gate line and a gate electrode, the gate electrode is connected to the gate line, and the gate line and the gate electrode are not in contact with the first common electrode line; the source/drain metal layer further includes a source electrode, a drain electrode and a data line, the source electrode is not in contact with the drain electrode, the source electrode is connected to the data line, and the data line is not in contact with the second common electrode line; and the pixel electrode layer further includes pixel electrodes, and the pixel electrodes are not in contact with the third common electrode line.

In a second aspect, a method for manufacturing an array substrate is provided. The method includes: forming a plurality of metal layers insulated from each other on a base, each of at least two metal layers of the plurality of metal layers including a common electrode line and the common electrode lines in the at least two metal layers being connected to each other.

Optionally, forming a plurality of metal layers insulated from each other on a base, each of at least two metal layers of the plurality of metal layers including a common electrode line and the common electrode lines in the at least two metal layers being connected to each other, includes: forming the plurality of metal layers insulated from each other on the base, each of the at least two metal layers of the plurality of metal layers including the common electrode line, forming an insulating layer between every two adjacent metal layers in the at least two metal layers, and forming a via hole in the insulating layer, and the common electrode lines in the at least two metal layers being connected to each other through the via hole.

Optionally, the at least two metal layers include a gate metal layer and a source/drain metal layer. Forming the plurality of metal layers insulated from each other on the base, each of the at least two metal layers of the plurality of metal layers including the common electrode line, forming an insulating layer between every two adjacent metal layers in the at least two metal layers, forming a via hole in the insulating layer, and the common electrode lines in the at least two metal layers being connected to each other through the via hole, includes: forming the gate metal layer on the base, the gate metal layer including a first common electrode line; forming a gate insulating layer on the gate metal layer; forming a first via hole in the gate insulating layer; and forming the source/drain metal layer on the gate insulating layer, the source/drain metal layer including a second common electrode line, and the second common electrode line being connected to the first common electrode line through the first via hole.

Optionally, the at least two metal layers further include a pixel electrode layer. The method further includes: forming an interlayer insulating layer on the source/drain metal layer; forming a second via hole in the interlayer insulating layer; forming the pixel electrode layer on the interlayer insulating layer, the pixel electrode layer including a third common electrode line and the third common electrode line being connected to the second common electrode line through the second via hole.

Optionally, the at least two metal layers include a gate metal layer, a source/drain metal layer and a pixel electrode layer. Forming a plurality of metal layers insulated from each other on the base, each of at least two metal layers of the plurality of metal layers including a common electrode line, forming an insulating layer between every two adjacent metal layers in the at least two metal layers, forming a via hole in the insulating layer, and the common electrode lines in the at least two metal layers being connected to each other through the via hole, includes: forming the gate metal layer on the base and the gate metal layer including a first common electrode line; forming a gate insulating layer on the gate metal layer; forming the source/drain metal layer on the gate insulating layer, the source/drain metal layer including a second common electrode line; forming an interlayer insulating layer on the source/drain metal layer; forming a second via hole in the interlayer insulating layer and a first via hole in the gate insulating layer by means of one patterning process, the second via hole being intercommunicated with the first via hole, and an area of an opening of the second via hole being greater than that of an opening of the first via hole; and forming the pixel electrode layer on the interlayer insulating layer, the pixel electrode layer including a third common electrode line, the third common electrode line being connected to the second common electrode line through the second via hole, and the third common electrode line being connected to the first common electrode line through the first via hole.

Optionally, there is an overlapped region between an orthographic projection of the second via hole on the base and an orthographic projection of the first via hole on the base.

Optionally, the gate metal layer further includes a gate line and a gate electrode, the gate electrode is connected to the gate line, and the gate line and the gate electrode are not in contact with the first common electrode line; the source/drain metal layer further includes a source electrode, a drain electrode and a data line, the source electrode is not in contact with the drain electrode, the source electrode is connected to the data line, and the data line is not in contact with the second common electrode line; and the pixel electrode layer further includes pixel electrodes, and the pixel electrodes are not in contact with the third common electrode line.

In a third aspect, a display device is provided, and the display device includes the above array substrate.

BRIEF DESCRIPTION OF THE DRAWINGS

In order to explain technical solutions of the present disclosure more clearly, accompanying drawings needed in description of embodiments of the present disclosure are briefly illustrated hereinafter. Obviously, the accompanying drawings described hereinafter show only some embodiments of the present disclosure, and those skilled in the art may further conceive other drawings according to the drawings without creative work.

DETAILED DESCRIPTION

In order to explain objects, technical solutions and advantages of the present disclosure more clearly, the present disclosure is illustrated in detail in conjunction with accompanying drawings. It is obvious that the described embodiments are only a part of the embodiments of the present disclosure, not all of the embodiments. All of other embodiments obtained by those skilled in the art on basis of the embodiments of the present disclosure without creative work fall into the protection scope of the present disclosure.

Figure 1:
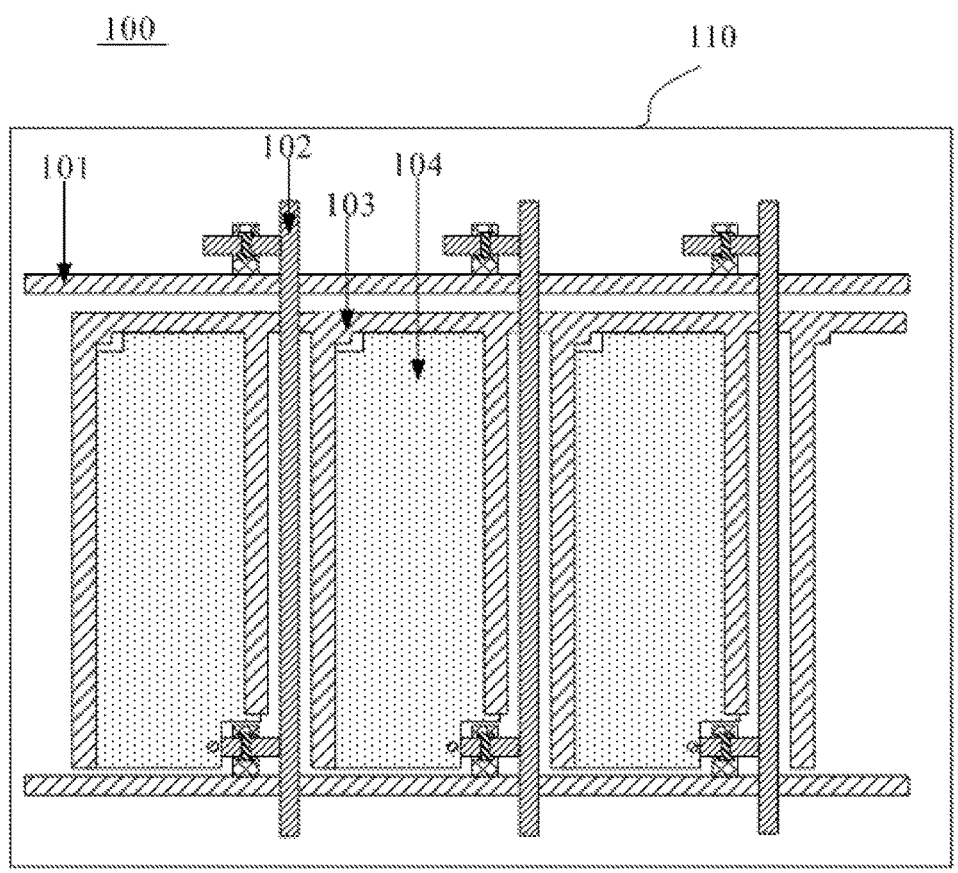
FIG. 1 is a top view of an array substrate in the related arts.

FIG. 1 shows a top view of an array substrate 100 in the related arts. Referring to FIG. 1, the array substrate 100 includes a base 110, and multiple gate lines 101 and multiple data lines 102 are arranged on the base 110. Each of the data lines 102 intersects with and is insulated from each of the gate lines 101. A pixel region is enclosed by two adjacent gate lines 101 and two adjacent data lines 102, a common electrode line 103 and a pixel electrode 104 which are insulated from each other are arranged in each pixel region. The pixel electrode 104 is arranged above the common electrode line 103, and the common electrode line 103 is arranged in a same layer as the gate lines 101. Generally certain space is arranged between the common electrode line 103 and the gate lines 101, in order to prevent the common electrode line 103 from being in contact with the gate lines 101 to cause short circuit.

Figure 2:
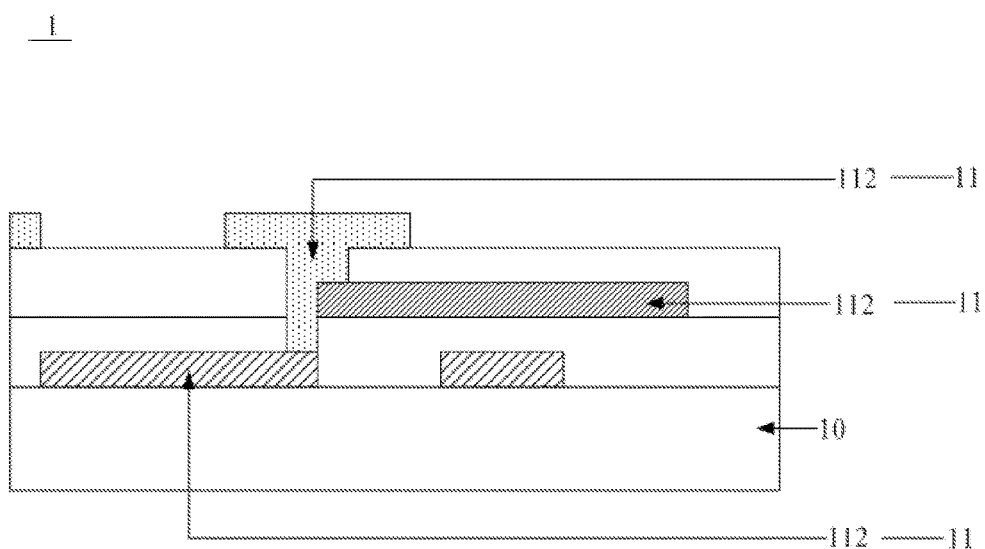
FIG. 2 is a structural schematic diagram of an array substrate provided in some embodiments of the present disclosure.

FIG. 2 shows a structural schematic diagram of an array substrate 1 provided in some embodiments of the present disclosure. Referring to FIG. 2, the array substrate 1 includes a base 10. Multiple metal layers 11 insulated from each other are arranged on the base 10. Each of at least two metal layers 11 of the multiple metal layers 11 includes a common electrode line 112, and the common electrode lines 112 in the at least two metal layers 11 are connected to each other.

In the array substrate provided in the present disclosure, since the common electrode lines 112 are arranged in at least two metal layers 11, and the common electrode lines 112 in the at least two metal layers 11 are connected to each other, planar distances between the common electrode lines and other signal lines may be reduced, solving the problem that the array substrate in the related art has a low aperture ratio and improving the aperture ratio of the array substrate.

Figure 3A:
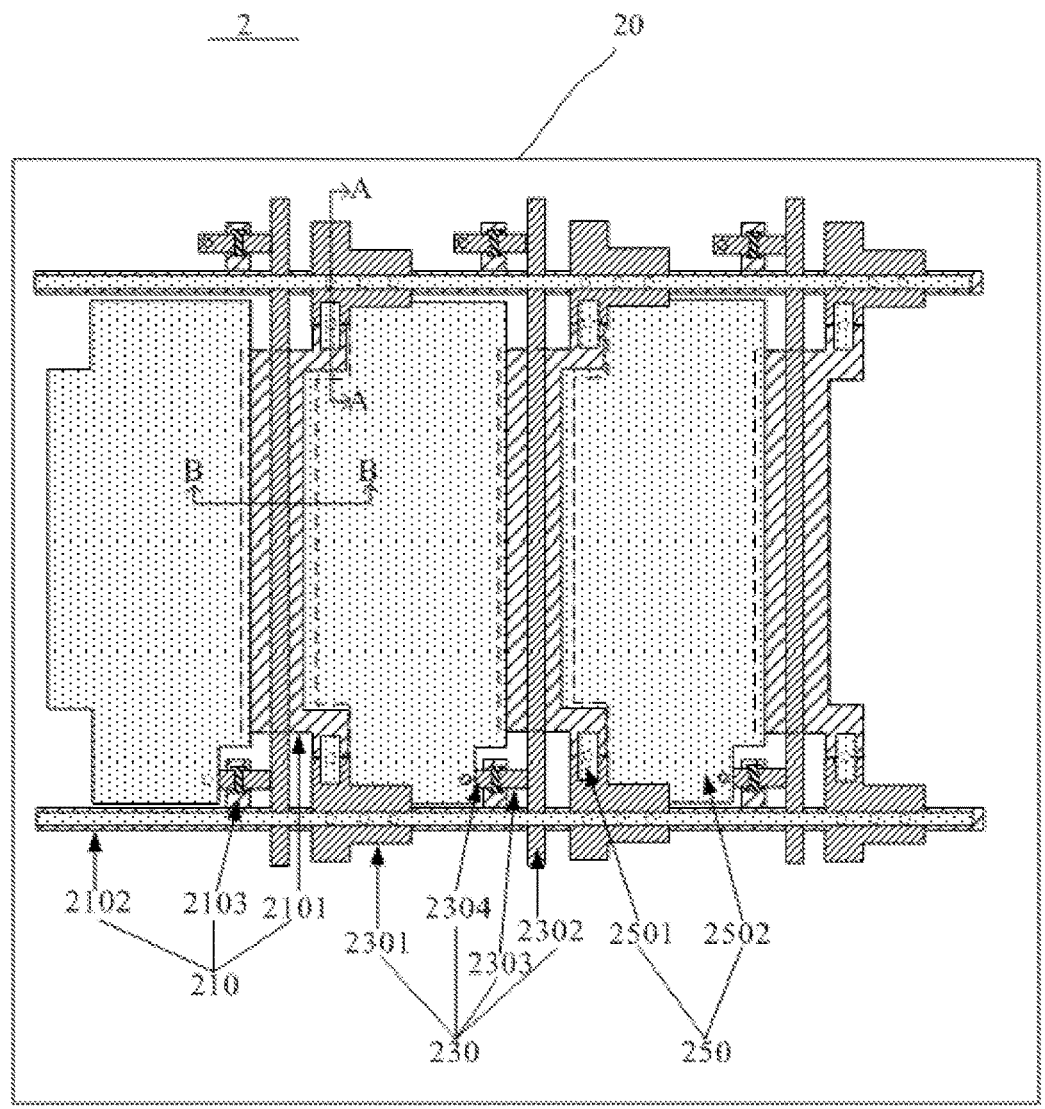
FIG. 3A is a top view of an array substrate provided in some embodiments of the present disclosure.

FIG. 3A shows a top view of an array substrate 2 provided in some embodiments of the present disclosure. Referring to FIG. 3A, the array substrate 2 includes a base 20. The base 20 may be a transparent substrate and may be made of rigid, light-transmitting and non-metallic materials, such as glass, quartz, transparent resin, or the like.

Multiple metal layers 21 insulated from each other are arranged on the base 20. Each of at least two metal layers 21 of the multiple metal layers 21 includes a common electrode line 212, and the common electrode lines 212 in the at least two metal layers 21 are connected to each other.

Optionally, an insulating layer (not shown in FIG. 3A) is arranged between every two adjacent metal layers in the at least two metal layers, a via hole (not shown in FIG. 3A) is formed in the insulating layer, and the common electrode lines 212 in the at least two metal layers are connected to each other through the via hole.

Figure 3B:
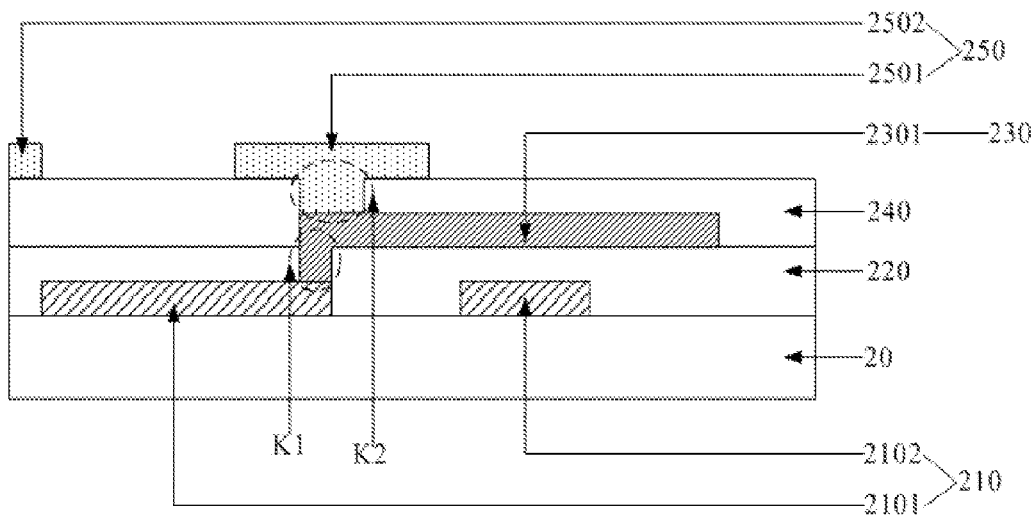
FIG. 3B is a sectional view of the array substrate shown in FIG. 3A taken along a line of A-A.
Figure 3C:
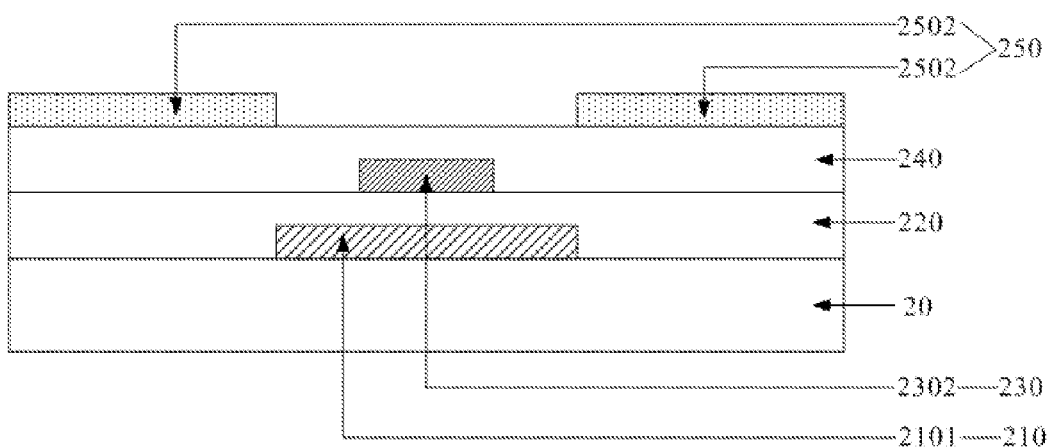
FIG. 3C is a sectional view of the array substrate shown in FIG. 3A taken along a line of B-B.

FIG. 3B is a sectional view of the array substrate shown in FIG. 3A taken along a line of A-A, and FIG. 3C is a sectional view of the array substrate shown in FIG. 3A taken along a line of B-B. Referring to FIG. 3A to FIG. 3C, the array substrate 2 includes a base 20, the at least two metal layers 21 include a gate metal layer 210 and a source/drain metal layer 230, and the gate metal layer 210 is arranged on the base 20 and includes a first common electrode line 2101; a gate insulating layer 220 is arranged on the base 20 on which the gate metal layer 210 has been arranged, and a first via hole K1 is formed in the gate insulating layer 220; and the source/drain metal layer 230 is arranged on the base 20 on which the gate insulating layer 220 has been arranged, the source/drain metal layer 230 includes a second common electrode line 2301, and the second common electrode line 2301 is connected to the first common electrode line 2101 through the first via hole K1.

Further, the at least two metal layers 21 further include a pixel electrode layer 250. An interlayer insulating layer 240 is formed on the base 20 on which the source/drain metal layer 230 has been arranged, and a second via hole K2 is formed in the interlayer insulating layer 240, the pixel electrode layer 250 is arranged on the base 20 on which the interlayer insulating layer 240 has been arranged, the pixel electrode layer 250 includes a third common electrode line 2501, and the third common electrode line 2501 is connected to the second common electrode line 2301 through the second via hole K2.

Figure 3D:
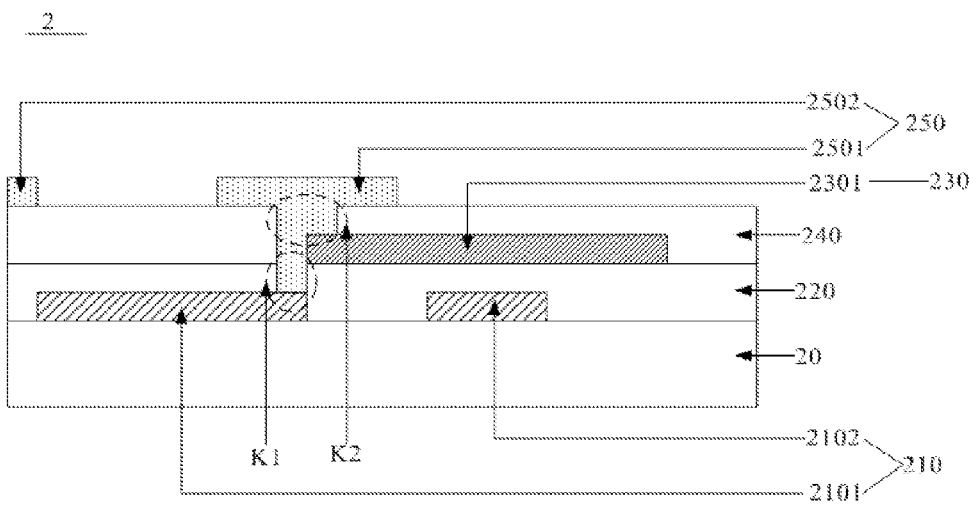
FIG. 3D is a sectional view of an array substrate provided in some embodiments of the present disclosure.

FIG. 3D is a sectional view of another example of an array substrate provided in some embodiments of the present disclosure. Referring to FIG. 3D, the array substrate 2 includes a base 20, the at least two metal layers 21 include a gate metal layer 210, a source/drain metal layer 230 and a pixel electrode layer 250. The gate metal layer 210 is arranged on the base 20, the gate metal layer 210 includes a first common electrode line 2101; a gate insulating layer 220 is arranged on the base 20 on which the gate metal layer 210 has been arranged, and a first via hole K1 is formed in the gate insulating layer 220; the source/drain metal layer 230 is arranged on the base 20 on which the gate insulating layer 220 has been arranged, and the source/drain metal layer 230 includes a second common electrode line 2301; an interlayer insulating layer 240 is arranged on the base 20 on which the source/drain metal layer 230 has been arranged, and a second via hole K2 is formed in the interlayer insulating layer 240, the second via hole K2 is intercommunicated with the first via hole K1, and an area of an opening of the second via hole K2 is greater than that of an opening of the first via hole K1; the pixel electrode layer 250 is arranged on the base 20 on which the interlayer insulating layer 240 has been arranged, the pixel electrode layer 250 includes a third common electrode line 2501, the third common electrode line 2501 is connected to the second common electrode line 2301 through the second via hole K2, and the third common electrode line 2501 is connected to the first common electrode line 2101 through the first via hole K1. It should be noted that, in the array substrate 2 shown in FIG. 3D, the first via hole K1 and the second via hole K2 may be formed in one patterning process, which is not defined in the embodiments of the present disclosure.

Optionally, referring to FIG. 3B or FIG. 3D, there is an overlapped region between an orthographic projection of the second via hole K2 on the base 20 and an orthographic projection of the first via hole K1 on the base 20.

Optionally, referring to FIG. 3A, the gate metal layer 210 further includes a gate line 2102 and a gate electrode 2103, the gate electrode 2103 is connected to the gate line 2102, and the gate line 2102 is not in contact with the first common electrode line 2101. The source/drain metal layer 230 further includes a source electrode 2303, a drain electrode 2304 and a data line 2302, and the data line 2302 is not in contact with the second common electrode line 2301, and the source electrode 2303 is not in contact with the drain electrode 2304, the source electrode 2303 is connected to the data line 2302. The pixel electrode layer 250 further includes a pixel electrode 2502, and the pixel electrode 2502 is not in contact with the third common electrode line 2501. A via hole (not shown in FIG. 3A to FIG. 3D) for a drain-electrode is further formed in the interlayer insulating layer 240, and the pixel electrode 2502 is connected to the drain electrode 2304 through the via hole for the drain electrode.

Generally, since in the array substrate according to the present disclosure, the common electrode lines are arranged in at least two metal layers, and the common electrode lines in the at least two metal layers are connected to each other, planar distances between the common electrode lines and other signal lines may be reduced, so that the problem that the array substrate in the related art has a low aperture ratio is solved and the aperture ratio of the array substrate is increased.

In the array substrate according to the present disclosure, the common electrode lines in different metal layers are connected to each other, so as to keep the common electrode lines to be in a networked structure and ensure the characteristics and yield of the array substrate.

Since in the array substrate according to the embodiments of the present disclosure, the common electrode lines are arranged in at least two metal layers and the common electrode lines in the at least two metal layers are connected to each other, planar distances between the common electrode lines and other signal lines may be reduced, and the aperture ratio of the array substrate is improved. The array substrate according to the embodiments of the present disclosure may be made by the method below. A method and a principle for manufacturing the array substrate in the embodiments of the present disclosure may be acquired from description below.

A method for manufacturing an array substrate is further provided in some embodiments of the present disclosure. The method for manufacturing an array substrate is used to manufacture the array substrate shown in any one of FIG. 2 to FIG. 3D. The method includes step S1.

Step S1: forming multiple metal layers insulated from each other on a base, which each of at least two metal layers of the multiple metal layers includes a common electrode line, and the common electrode lines in the at least two metal layers are connected to each other.

In the array substrate manufactured by the method for manufacturing an array substrate according to the present disclosure, the common electrode lines are arranged in at least two metal layers and the common electrode lines in the at least two metal layers are connected to each other, therefore, planar distances between the common electrode lines and other signal lines may be reduced, the problem that the array substrate in the related art has a low aperture ratio is solved and the aperture ratio of the array substrate is increased.

Optionally, the above step S1 further includes step S11.

Step S11: forming multiple metal layers insulated from each other on the base, which each of at least two metal layers of the multiple metal layers includes a common electrode line, an insulating layer is formed between every two adjacent metal layers in the at least two metal layers, a via hole is formed on the insulating layer, and the common electrode lines in the at least two metal layers are connected to each other through the via hole.

Optionally, the at least two metal layers include a gate metal layer and a source/drain metal layer.

The above step S11 further includes step S111 to step S114.

Step S111: forming a gate metal layer on the base, which the gate metal layer includes a first common electrode line.

Step S112: forming a gate insulating layer on the gate metal layer.

Step S113: forming a first via hole on the gate insulating layer.

Step S114: forming a source/drain metal layer on the gate insulating layer, wherein the source/drain metal layer includes a second common electrode line, and the second common electrode line is connected to the first common electrode line through the first via hole.

Optionally, the at least two metal layers further include a pixel electrode layer.

The above step S11 further includes step S115 to step S117.

Step S115: forming an interlayer insulating layer on the source/drain metal layer.

Step S116: forming a second via hole in the interlayer insulating layer.

Step S117: forming the pixel electrode layer on the interlayer insulating layer, wherein the pixel electrode layer includes a third common electrode line, and the third common electrode line is connected to the second common electrode line through the second via hole.

Optionally, the at least two metal layers include a gate metal layer, a source/drain metal layer and a pixel electrode layer.

Optionally, the above step S11 further includes step S121 to step S126.

Step S121: forming the gate metal layer on the base, wherein the gate metal layer includes a first common electrode line.

Step S122: forming a gate insulating layer on the gate metal layer.

Step S123: forming the source/drain metal layer on the gate insulating layer, wherein the source/drain metal layer includes a second common electrode line.

Step S124: forming an interlayer insulating layer on the source/drain metal layer.

Step S125: forming a second via hole in the interlayer insulating layer and forming a first via hole in the gate insulating layer in one patterning process, wherein the second via hole is intercommunicated with the first via hole, and an area of an opening of the second via hole is greater than that of an opening of the first via hole.

Step S126: forming the pixel electrode layer on the interlayer insulating layer, wherein the pixel electrode layer includes a third common electrode line, the third common electrode line is connected to the second common electrode line through the second via hole and is connected to the first common electrode line through the first via hole.

Optionally, there is an overlapped region between an orthographic projection of the second via hole on the base and an orthographic projection of the first via hole on the base.

Optionally, the gate metal layer further includes a gate line, and the gate line is not in contact with the first common electrode line; the source/drain metal layer further includes a data line, and the data line is not in contact with the second common electrode line.

Optionally, the gate metal layer further includes a gate electrode, and the gate electrode is connected to the gate line; the source/drain metal layer further includes a source electrode and a drain electrode, the source electrode is not in contact with the drain electrode, and the source electrode is connected to the data line; and the pixel electrode layer further includes pixel electrodes, and the pixel electrodes are not in contact to the third common electrode line. A via hole for a drain electrode is further formed on the interlayer insulating layer, and the pixel electrodes are connected to the drain electrode through the via hole for the drain electrode.

The technical solutions described above may be combined in any manner to constitute the embodiments of the present disclosure, which is not set forth any more herein.

Figure 4A:
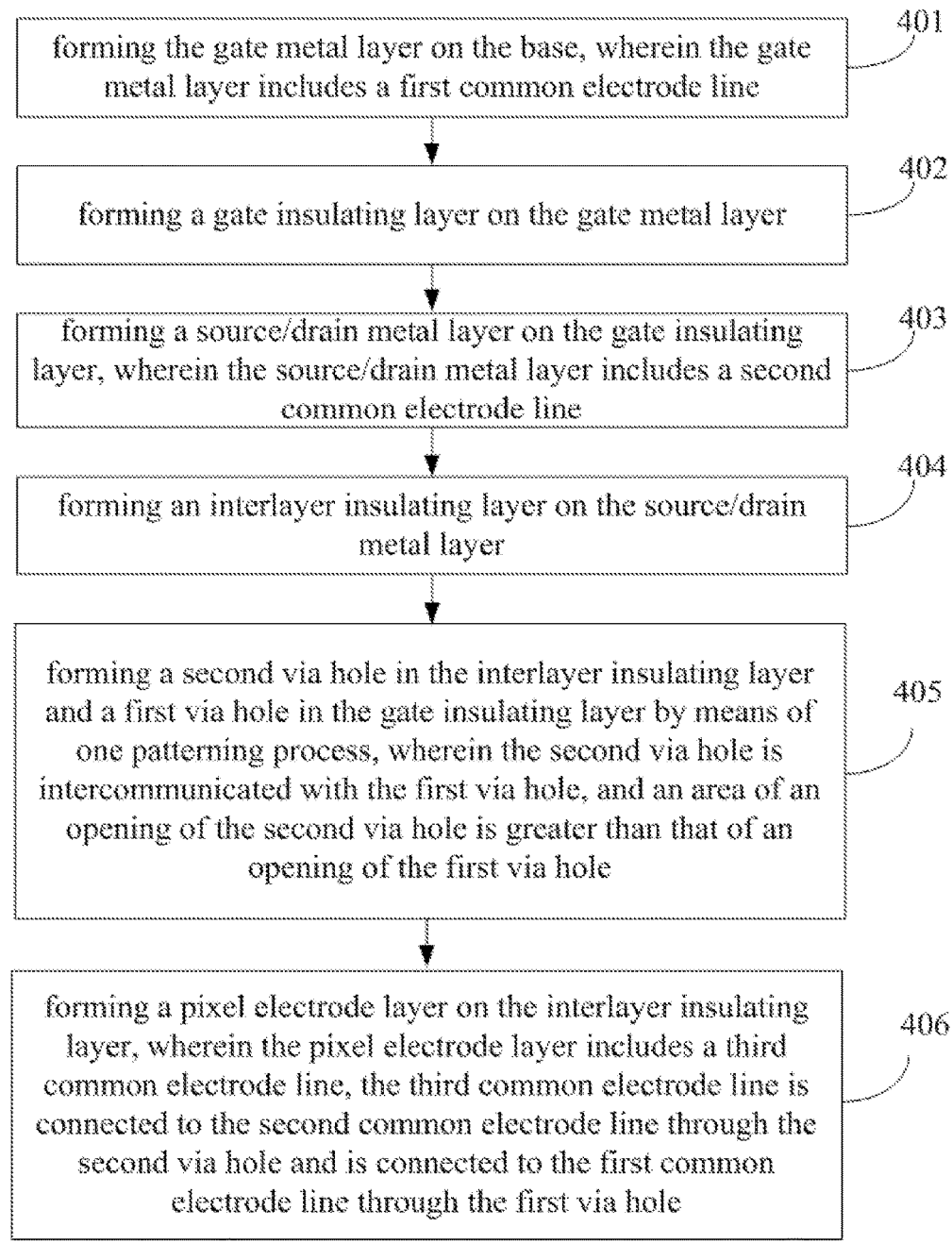
FIG. 4A is a flowchart of a method for manufacturing an array substrate provided in some embodiments of the present disclosure.

FIG. 4A is a flowchart of a method for manufacturing an array substrate provided in some embodiments of the present disclosure. The method for manufacturing an array substrate is used to manufacture the array substrate shown in any one of FIG. 2 to FIG. 3D. The method for manufacturing an array substrate according to the embodiment is illustrated by taking manufacture of the array substrate 2 shown in FIG. 3D as an example. Referring to FIG. 4A, the method may include step 401 to step 406.

Step 401: forming the gate metal layer on the base, wherein the gate metal layer includes a first common electrode line.

Figure 4B:
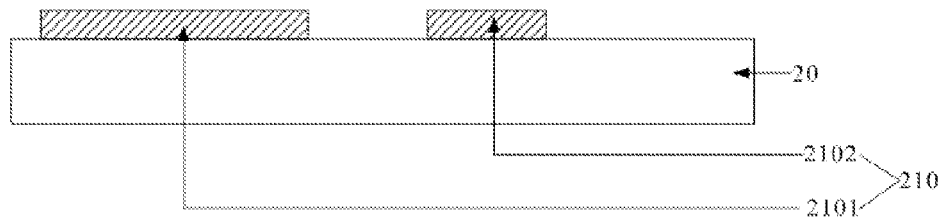
FIG. 4B is a schematic diagram of a structure formed after a gate metal layer is formed on a base through the method shown in FIG. 4A.

FIG. 4B is a schematic diagram of a structure formed after the gate metal layer 210 is formed on a base 20 through the method shown in FIG. 4A. The base 20 may be a transparent substrate and may be made of rigid, light-transmitting and non-metallic materials, such as glass, quartz, transparent resin or the like. The gate metal layer 210 includes a first common electrode line 2101, and the gate metal layer 210 further includes a gate line 2102 and a gate electrode (not shown in FIG. 4B), the gate electrode is connected to the gate line 2102, and the gate line 2102 is not in contact with the first common electrode line 2101, and the first common electrode line 2101 is not in contact with the gate electrode. The gate metal layer 210 may be made of metals such as Mo, Cu and Al and their alloy materials, and a thickness of the gate metal layer 210 may be set according to actual situations, which is not defined in the embodiment of the present disclosure.

The gate metal layer 210 may be formed by the following step 1 and step 2.

Step 1: depositing a layer of metal material on the base 20 by means of coating, magnetron sputtering, thermal evaporation, or plasma enhanced chemical vapor deposition (PECVD).

Step 2: processing the layer of metal material layer by means of one patterning process.

The one patterning process includes photoresist coating, exposure, development, etching and photoresist stripping. Thus, the above step 2 may include step S31 to step S34.

Step S31: coating a layer of photoresist onto the layer of metal material.

Step S32: exposing the layer of photoresist by using a mask to form a fully-exposed region and a non-exposed region.

Step S33: processing the fully-exposed region and the non-exposed region by using a development process to remove the photoresist in the fully-exposed region and retain the photoresist in the non-exposed region.

Step S34: etching a region in the layer of metal material corresponding to the fully-exposed region, and stripping the photoresist in the non-exposed region after the etching is finished.

It should be noted that the present embodiment is illustrated by taking a positive photoresist being used to form the gate metal layer 210 as an example. In a practical application, a negative photoresist may also be used to form the gate metal layer 210, which is not set forth any more in the embodiments of the present disclosure.

Step 402: forming a gate insulating layer on the gate metal layer.

Figure 4C:
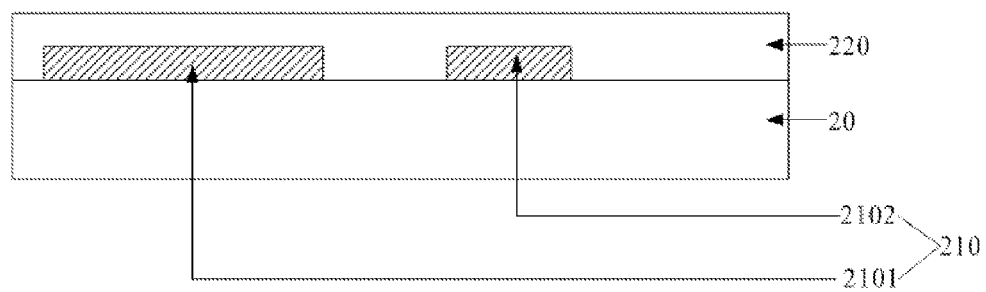
FIG. 4C is a schematic diagram of a structure formed after a gate insulating layer is formed on the gate metal layer through the method shown in FIG. 4A.

FIG. 4C shows a schematic diagram of a structure formed after the gate insulating layer 220 is formed on the gate metal layer 210 through the method shown in FIG. 4A. The gate insulating layer 220 may be made of inorganic materials such as silicon oxide, silicon nitride, and aluminum oxide, the thickness of the gate insulating layer 220 may be set according to actual situations, which is not defined in the embodiment of the present disclosure.

A layer of inorganic material having a certain thickness may be deposited on the base 20 on which the gate metal layer 210 has been arranged by means of coating, magnetron sputtering, thermal evaporation, or PECVD, and the layer of inorganic material is baked to form the gate insulating layer 220. In a practical application, in a case that a pattern is included in the gate insulating layer 220, the layer of inorganic material may be processed by means of one patterning process to form the gate insulating layer 220, which is not defined in the embodiment of the present disclosure.

Step 403: forming a source/drain metal layer on the gate insulating layer, wherein the source/drain metal layer includes a second common electrode line.

Figure 4D:
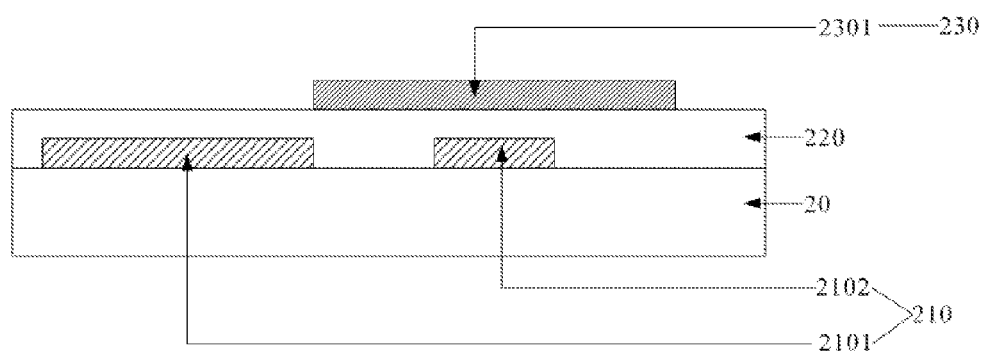
FIG. 4D is a schematic diagram of a structure formed after a source/drain metal layer is formed on the gate insulating layer through the method shown in FIG. 4A.

FIG. 4D shows a schematic diagram of a structure formed after the source/drain metal layer 230 is formed on the gate insulating layer 220 through the method shown in FIG. 4A. referring to FIG. 4D, the source/drain metal layer 230 includes a second common electrode line 2301, and the source/drain metal layer 230 further includes a data line (not shown in FIG. 4D), a source electrode (not shown in FIG. 4D) and a drain electrode (not shown in FIG. 4D), the data line is not in contact with the second common electrode line 2301, the source electrode is not in contact with the drain electrode, and the source electrode is connected to the data line. The source/drain metal layer 230 may be made of metal materials, such as Mo, Cu and Al and their alloy materials. A thickness of the source/drain metal layer 230 may be set according to actual situations, which is not defined in the embodiment of the present disclosure.

A layer of metal material may be deposited on the gate insulating layer 220 by means of coating, magnetron sputtering, thermal evaporation, or PECVD, and the layer of metal material is processed by means of once patterning process to obtain the source/drain metal layer 230. For a process of processing the layer of metal material by means of one patterning process, reference may be made to step 401, which is not set forth any more in the embodiment of the present disclosure.

Step 404: forming an interlayer insulating layer on the source/drain metal layer.

Figure 4E:
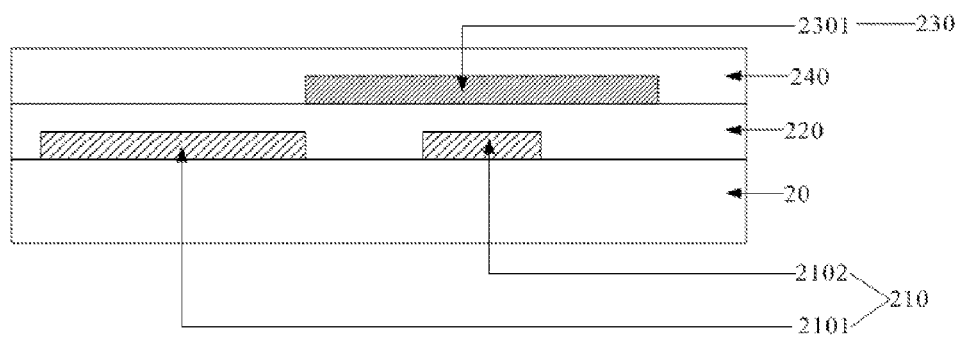
FIG. 4E is a schematic diagram of a structure formed after an interlayer insulating layer is formed on the source/drain metal layer through the method shown in FIG. 4A.

FIG. 4E shows a schematic diagram of a structure formed after the interlayer insulating layer 240 is formed on a source/drain metal layer 230 through the method shown in FIG. 4A. For the process of forming the interlayer insulating layer 240, reference may be made to the process of forming the gate insulating layer 220 in step 402, which is not set forth any more in the embodiment of the present disclosure.

Step 405: forming a second via hole in the interlayer insulating layer and a first via hole in the gate insulating layer by means of one patterning process, wherein the second via hole is intercommunicated with the first via hole, and an area of an opening of the second via hole is greater than that of an opening of the first via hole.

Figure 4F:
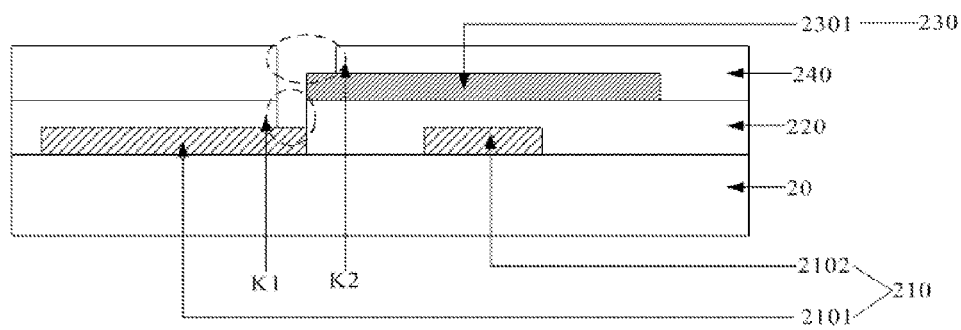
FIG. 4F is a schematic diagram of a structure formed after a second via hole is formed in the interlayer insulating layer and a first via hole is formed in the gate insulating layer by means of one patterning process through the method shown in FIG. 4A.

FIG. 4F shows a schematic diagram of a structure formed after the second via hole K2 is formed on the interlayer insulating layer 240 and the first via hole K1 is formed on the gate insulating layer 220 by means of one patterning process through the method shown in FIG. 4A. Referring to FIG. 4F, the second via hole K2 is intercommunicated with the first via hole K1, and an area of an opening of the second via hole K2 is greater than that of an opening of the first via hole K1, and there is an overlapped region between an orthographic projection of the second via hole K2 on the base 20 and an orthographic projection of the first via hole K1 on the base 20.

The forming a second via hole K2 in the interlayer insulating layer 240 and a first via hole K1 in the gate insulating layer 220 by means of once patterning process may include step S41 to step S46.

Step S41: coating a layer of photoresist onto the interlayer insulating layer 240.

Step S42: exposing the layer of photoresist by using a mask to form a fully-exposed region and a non-exposed region.

Step S43: processing the full-exposed region and the non-exposed region by using a development process to remove the photoresist in the fully-exposed region and retain the photoresist in the non-exposed region.

Step S44: etching a region in the interlayer insulating layer 240 and the gate insulating layer 220 corresponding to the fully-exposed region, and stripping the photoresist in the non-exposed region after the etching is finished. In this way, a second via hole K2 may be formed in the interlayer insulating layer 240, and a first via hole K1 may be formed in the gate insulating layer 220. It should be noted that, the etching in this step may be a wet etching process, and the wet etching process generally may be applied for an inorganic material, but may not be applied for the layer of metal material. Specifically, a region in the interlayer insulating layer 240 corresponding to the fully-exposed region may be etched by means of the wet etching process to obtain the second via hole K2, and then the bottom of the second via hole K2 is further etched to obtain the first via hole K1, which is not defined in the embodiment of the present disclosure.

Step 406: forming a pixel electrode layer on the interlayer insulating layer, wherein the pixel electrode layer includes a third common electrode line, the third common electrode line is connected to the second common electrode line through the second via hole and is connected to the first common electrode line through the first via hole.

FIG. 3D is a schematic diagram of a structure formed after the pixel electrode layer 250 is formed on the interlayer insulating layer 240. The pixel electrode layer 250 includes a third common electrode line 2501 and pixel electrodes 2502, the third common electrode line 2501 is connected to the second common electrode line 2301 through the second via hole K2, and the third common electrode line 2501 is connected to the first common electrode line 2101 through the first via hole K1. It should be noted that, in a practical application, a via hole for a drain electrode (not shown in FIG. 3D) is formed in the interlayer insulating layer 240, and each pixel electrode 2502 is connected to a corresponding drain electrode in the source/drain metal layer 230 through the via hole for the drain electrode. The pixel electrode layer 250 may be made of metallic oxides such as Indium tin oxide (ITO), Indium zinc oxide (IZO). A thickness of the pixel electrode layer 250 may be set according to actual situations, which is not defined in the embodiment of the present disclosure.

A layer of ITO material may be deposited on the base 20 on which the interlayer insulating layer 240 has been arranged by means of coating, magnetron sputtering, thermal evaporation, or PECVD. Then, the layer of ITO material is processed by means of one patterning process to obtain the pixel electrode layer 250. For the process of processing the layer of ITO material by means of once patterning process, reference may be made to step 401, which is not set forth any more in the embodiment of the present disclosure.

Figure 5A:
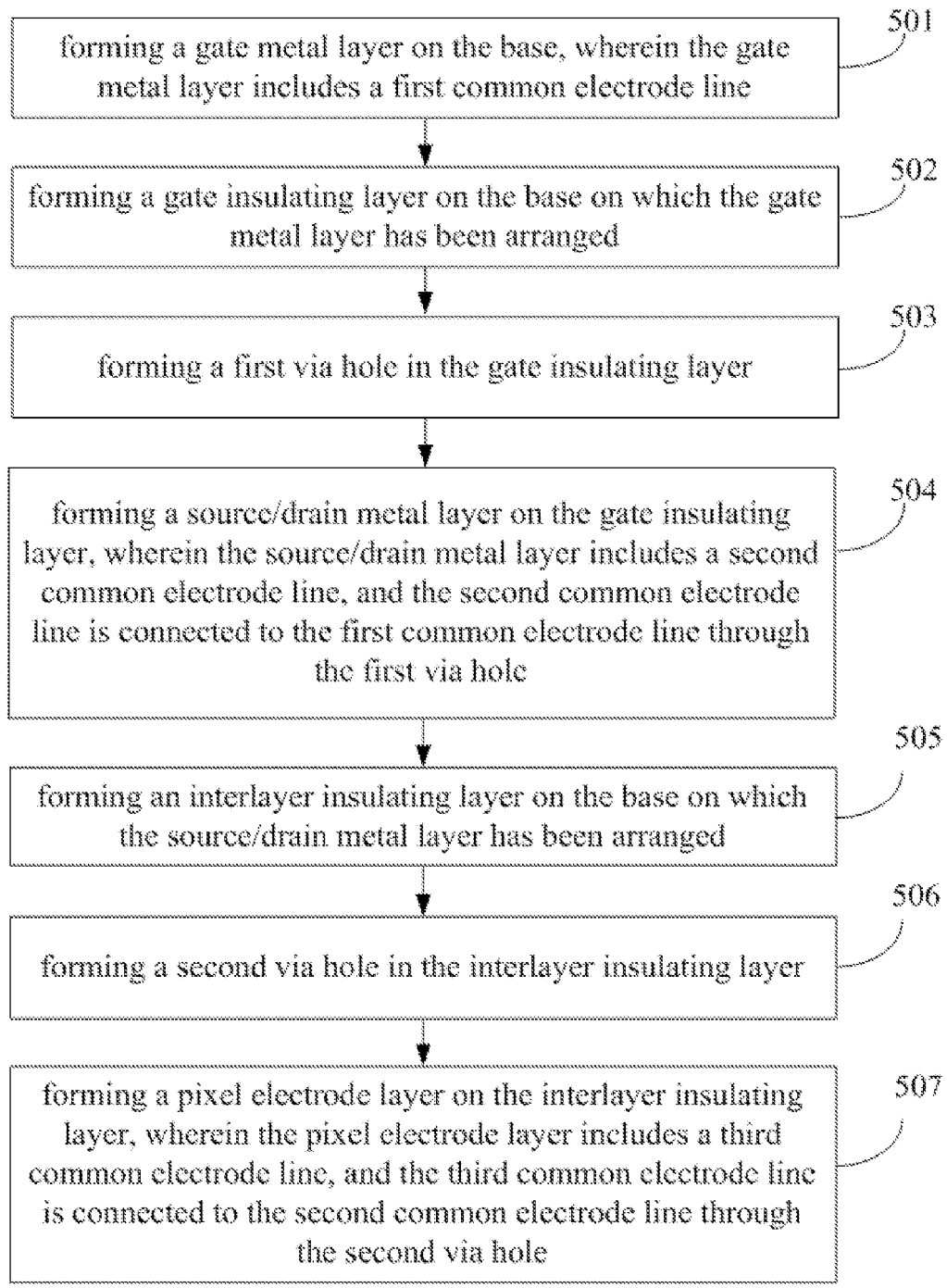
FIG. 5A is a flowchart of a method for manufacturing an array substrate provided in some embodiments of the present disclosure.

FIG. 5A is a flowchart of another example of a method for manufacturing an array substrate provided in some embodiments of the present disclosure. The example of the method for manufacturing an array substrate in the present embodiment is used to manufacture the array substrate shown in any one of FIG. 2 to FIG. 3D. The embodiment is illustrated by taking the manufacture of the array substrate 2 shown in FIG. 3B as an example. Referring to FIG. 5A, the method may include step 501 to step 507.

Step 501: forming a gate metal layer on the base, wherein the gate metal layer includes a first common electrode line.

Step 502: forming a gate insulating layer on the base on which the gate metal layer has been arranged.

For an implementation of the above step 501 and step 502, reference may be made to the above step 401 and step 402 in the embodiment shown in FIG. 4A, which is not set forth any more in the embodiment of the present disclosure.

Step 503: forming a first via hole in the gate insulating layer.

Figure 5B:
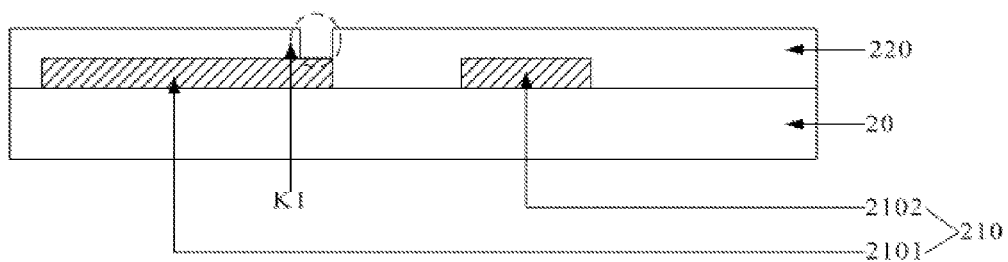
FIG. 5B is a schematic diagram of a structure formed after a first via hole is formed in a gate insulating layer through the method shown in FIG. 5A.

FIG. 5B shows a schematic diagram of a structure formed after the first via hole K1 is formed in the gate insulating layer 220 through the method shown in FIG. 5A. The first via hole K1 may be formed in the gate insulating layer 220 by means of one patterning process. Specifically, a layer of photoresist is coated onto the gate insulating layer 220. Then, the layer of photoresist is exposed by using a mask to form a fully-exposed region and a non-exposed region. Thereafter, a development process is used to remove the photoresist in the fully-exposed region and retain the photoresist in the non-exposed region, and a region in the gate insulating layer 220 corresponding to the fully-exposed region is etched, and the photoresist in the non-exposed region is stripped after the etching is finished. In this way, the first via hole K1 may be formed in the gate insulating layer 220.

Step 504: forming a source/drain metal layer on the gate insulating layer, wherein the source/drain metal layer includes a second common electrode line, and the second common electrode line is connected to the first common electrode line through the first via hole.

Figure 5C:
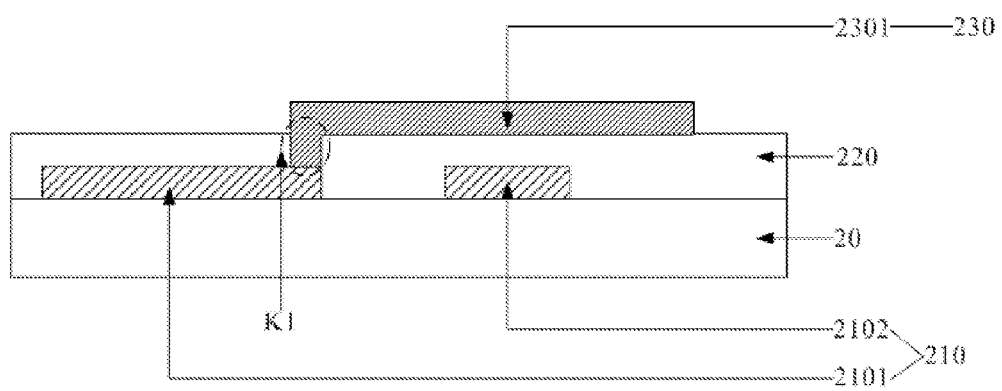
FIG. 5C is a schematic diagram of a structure formed after a source/drain metal layer is formed on the gate insulating layer through the method shown in FIG. 5A.

FIG. 5C is a schematic diagram of a structure formed after the source/drain metal layer 230 is formed on the gate insulating layer 220 through the method shown in FIG. 5A. Referring to FIG. 5C, the source/drain metal layer 230 includes a second common electrode line 2301, the second common electrode line 2301 is connected to the first common electrode line 2101 through the first via hole K1, and the source/drain metal layer 230 further includes a data line (not shown in FIG. 5C), a source electrode (not shown in FIG. 5C) and a drain electrode (not shown in FIG. 5C). The data line is not in contact with the second common electrode line 2301, the source electrode is not in contact with the drain electrode, and the source electrode is connected to the data line. For a specific process of forming the source/drain metal layer 230, reference may be made to step 403 in the embodiment shown in FIG. 4A, which is not set forth any more in the embodiment of the present disclosure.

Step 505: forming an interlayer insulating layer on the base on which the source/drain metal layer has been arranged.

Figure 5D:
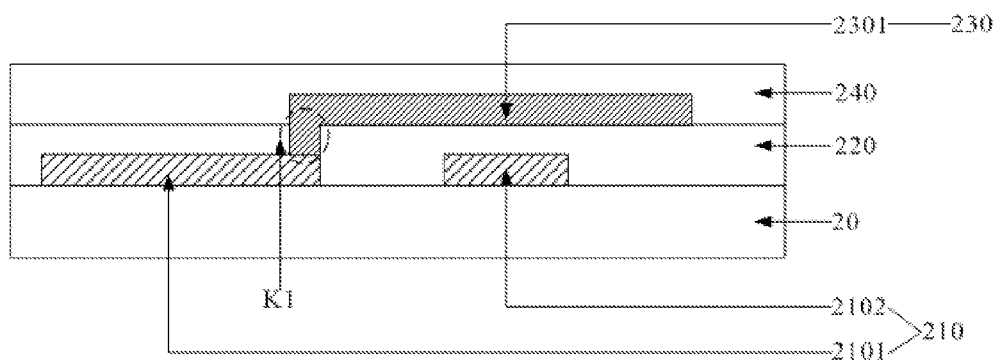
FIG. 5D is a schematic diagram of a structure formed after an interlayer insulating layer is formed on the source/drain metal layer through the method shown in FIG. 5A.

FIG. 5D shows a schematic diagram of a structure formed after the interlayer insulating layer 240 is formed on the base 20 on which the source/drain metal layer 230 has been arranged through the method shown in FIG. 5A. For a specific process of forming the interlayer insulating layer 240, reference may be made to step 404 in the embodiment shown in FIG. 4A, which is not set forth any more in the embodiment of the present disclosure.

Step 506: forming a second via hole in the interlayer insulating layer.

Figure 5E:
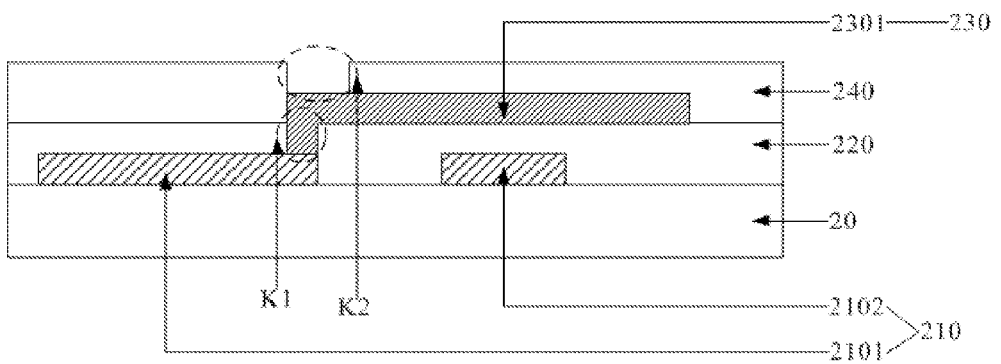
FIG. 5E is a schematic diagram of a structure formed after a second via hole is formed in the interlayer insulating layer through the method shown in FIG. 5A.

FIG. 5E shows a schematic diagram of a structure formed after the second via hole K2 is formed in the interlayer insulating layer 240 through the method shown in FIG. 5A. Referring to FIG. 5E, there is an overlapped region between an orthographic projection of the second via hole K2 on the base 20 and an orthographic projection of the first via hole K1 on the base 20. The second via hole K2 may be formed in the interlayer insulating layer 240 by means of one patterning process. Specifically, a layer of photoresist is coated onto the interlayer insulating layer 240, and then the layer of photoresist is exposed by using a mask to form a fully-exposed region and a non-exposed region. Thereafter, a development process is used to remove the photoresist in the fully-exposed region and retain the photoresist in the non-exposed region, and a region in the interlayer insulating layer 240 corresponding to the fully-exposed region is etched, and the photoresist in the non-exposed region is stripped after the etching is finished. In this way, the second via hole K2 may be formed in the interlayer insulating layer 240.

Step 507: forming a pixel electrode layer on the interlayer insulating layer, wherein the pixel electrode layer includes a third common electrode line, and the third common electrode line is connected to the second common electrode line through the second via hole.

FIG. 3B is a schematic diagram of a structure formed after the pixel electrode layer 250 is formed on the interlayer insulating layer 240. The pixel electrode layer 250 includes a third common electrode line 2501 and the pixel electrode 2502, the pixel electrode 2502 is not in contact with the third common electrode line 2501, and the third common electrode line 2501 is connected to the second common electrode line 2301 through the second via hole K2. For a specific process of forming the pixel electrode layer 250, rReference may be made to step 406 in the embodiment shown in FIG. 4A, which is not set forth any more in the embodiment.

A display device is further provided in some embodiments of the present disclosure. The display device includes the array substrate shown in any one of FIG. 2 to FIG. 3D. The display device may be any product or component having a display function, such as a liquid crystal display panel, an electronic paper, a mobile phone, a tablet computer, a television, a display, a notebook computer, a digital photo frame, or a navigator.

Because in the display device according to the embodiment of the present disclosure, the common electrode lines are arranged in at least two metal layers, and the common electrode lines in the at least two metal layers are connected to each other, planar distances between the common electrode lines and other signal lines (distances between the common electrode lines and other signal lines arranged in the same layer as the common electrode lines) may be reduced, and the problem that the array substrate in the related art has a low aperture ratio is solved and the aperture ratio of the array substrate is increased.

The above are only optional embodiments of the present disclosure and are not intended to limit the present disclosure. Any changes, equivalent substitutions, and improvements made within the spirit and principles of the present disclosure all fall into the protection scope of the present disclosure.

What is claimed is:

1. A method for manufacturing an array substrate, comprising:
   forming a plurality of metal layers insulated from each other on a base, each of at least two metal layers of the plurality of metal layers comprising a common electrode line, and the common electrode line in one metal layer of the at least two metal layers being connected to the common electrode line in another metal layer of the at least two metal layers.

2. The method according to claim 1, wherein, forming a plurality of metal layers insulated from each other on a base, each of at least two metal layers of the plurality of metal layers comprising a common electrode line, and the common electrode line in one metal layer of the at least two metal layers being connected to the common electrode line in another metal layer of the at least two metal layers, comprises:
   forming the plurality of metal layers insulated from each other on the base, each of the at least two metal layers of the plurality of metal layers comprising the common electrode line,
   forming an insulating layer between every two adjacent metal layers in the at least two metal layers, and
   forming a via hole in the insulating layer, and the common electrode line in one metal layer of the at least two metal layers being connected to the common electrode line in another metal layer of the at least two metal layers through the via hole.

3. The method according to claim 2, wherein the at least two metal layers comprise a gate metal layer, a source/drain metal layer and a pixel electrode layer,
   forming a plurality of metal layers insulated from each other on the base, each of at least two metal layers of the plurality of metal layers comprising a common electrode line, forming an insulating layer between every two adjacent metal layers in the at least two metal layers, forming a via hole in the insulating layer, and the common electrode line in one metal layer of the at least two metal layers being connected to the common electrode line in another metal layer of the at least two metal layers through the via hole comprises:
   forming the gate metal layer on the base and the gate metal layer comprising a first common electrode line;
   forming a gate insulating layer on the gate metal layer;
   forming the source/drain metal layer on the gate insulating layer, the source/drain metal layer comprising a second common electrode line;
   forming an interlayer insulating layer on the source/drain metal layer;
   forming a second via hole in the interlayer insulating layer and a first via hole in the gate insulating layer by means of one patterning process, the second via hole being intercommunicated with the first via hole, and an area of an opening of the second via hole being greater than that of an opening of the first via hole; and forming the pixel electrode layer on the interlayer insulating layer, the pixel electrode layer comprising a third common electrode line, the third common electrode line being connected to the second common electrode line through the second via hole, and the third common electrode line being connected to the first common electrode line through the first via hole.

4. The method according to claim 3, wherein
the gate metal layer further comprises a gate line and a gate electrode, the gate electrode is connected to the gate line, and the gate line and the gate electrode are not in contact with the first common electrode line;
the source/drain metal layer further comprises a source electrode, a drain electrode and a data line, the source electrode is not in contact with the drain electrode, the source electrode is connected to the data line, and the data line is not in contact with the second common electrode line; and
the pixel electrode layer further comprises pixel electrodes, and the pixel electrodes are not in contact with the third common electrode line.

5. The method according to claim 3, wherein
there is an overlapped region between an orthographic projection of the second via hole on the base and an orthographic projection of the first via hole on the base.

6. The method according to claim 2, wherein the at least two metal layers comprise a gate metal layer and a source/drain metal layer, and
forming the plurality of metal layers insulated from each other on the base, each of the at least two metal layers of the plurality of metal layers comprising the common electrode line, forming an insulating layer between every two adjacent metal layers in the at least two metal layers, forming a via hole in the insulating layer, and the common electrode line in one metal layer of the at least two metal layers being connected to the common electrode line in another metal layer of the at least two metal layers through the via hole, comprises:
forming the gate metal layer on the base, the gate metal layer comprising a first common electrode line;
forming a gate insulating layer on the gate metal layer;
forming a first via hole in the gate insulating layer; and
forming the source/drain metal layer on the gate insulating layer, the source/drain metal layer comprising a second common electrode line, and the second common electrode line being connected to the first common electrode line through the first via hole.

7. The method according to claim 6, wherein the at least two metal layers further comprise a pixel electrode layer, the method further comprises:
forming an interlayer insulating layer on the source/drain metal layer;
forming a second via hole in the interlayer insulating layer;
forming the pixel electrode layer on the interlayer insulating layer, the pixel electrode layer comprising a third common electrode line and the third common electrode line being connected to the second common electrode line through the second via hole.

8. The method according to claim 7, wherein
the gate metal layer further comprises a gate line and a gate electrode, the gate electrode is connected to the gate line, and the gate line and the gate electrode are not in contact with the first common electrode line;
the source/drain metal layer further comprises a source electrode, a drain electrode and a data line, the source electrode is not in contact with the drain electrode, the source electrode is connected to the data line, and the data line is not in contact with the second common electrode line; and
the pixel electrode layer further comprises pixel electrodes, and the pixel electrodes are not in contact with the third common electrode line.

9. The method according to claim 7, wherein
there is an overlapped region between an orthographic projection of the second via hole on the base and an orthographic projection of the first via hole on the base.

10. An array substrate, comprising:
a base; and
a plurality of metal layers configured to be insulated from each other and be arranged on the base,
wherein each of at least two metal layers of the plurality of metal layers comprises a common electrode line, and the common electrode line in one metal layer of the at least two metal layers is connected to the common electrode line in another metal layer of the at least two metal layers.

11. The array substrate according to claim 10, wherein the at least two metal layers comprise three metal layers, and the common electrode line in a first metal layer of the three metal layers is directly connected to the common electrode line in a second metal layer of the three metal layers and directly connected to the common electrode line in a third metal layer of the three metal layers, and the first metal layer is below the second metal layer and above the third metal layer.

12. A display device, comprising:
the array substrate according to claim 10.

13. The array substrate according to claim 10, wherein an insulating layer is arranged between every two adjacent metal layers in the at least two metal layers, and a via hole is formed in the insulating layer, and the common electrode line in one metal layer of the at least two metal layers is connected to the common electrode line in another metal layer of the at least two metal layers through the via hole.

14. The array substrate according to claim 13, wherein the at least two metal layers comprise a gate metal layer, a source/drain metal layer and a pixel electrode layer,
the gate metal layer is arranged on the base and comprises a first common electrode line;
a gate insulating layer is arranged on the gate metal layer, and a first via hole is formed in the gate insulating layer;
the source/drain metal layer is arranged on the gate insulating layer and comprises a second common electrode line;
an interlayer insulating layer is formed on the source/drain metal layer, a second via hole is formed in the interlayer insulating layer, the second via hole is intercommunicated with the first via hole, and an area of an opening of the second via hole is greater than that of an opening of the first via hole; and
the pixel electrode layer is arranged on the interlayer insulating layer, the pixel electrode layer comprises a third common electrode line, the third common electrode line is connected to the second common electrode line through the second via hole, and the third common electrode line is connected to the first common electrode line through the first via hole.

15. The array substrate according to claim 14, wherein
the gate metal layer further comprises a gate line and a gate electrode, the gate electrode is connected to the gate line, and the gate line and the gate electrode are not in contact with the first common electrode line;

the source/drain metal layer further comprises a source electrode, a drain electrode and a data line, the source electrode is not in contact with the drain electrode, the source electrode is connected to the data line, and the data line is not in contact with the second common electrode line; and the pixel electrode layer further comprises pixel electrodes, and the pixel electrodes are not in contact with the third common electrode line.

16. The array substrate according to claim 14, wherein there is an overlapped region between an orthographic projection of the second via hole on the base and an orthographic projection of the first via hole on the base.

17. The array substrate according to claim 13, wherein the at least two metal layers comprise a gate metal layer and a source/drain metal layer, the gate metal layer is arranged on the base and comprises a first common electrode line;

a gate insulating layer is arranged on the gate metal layer, and a first via hole is formed in the gate insulating layer; and the source/drain metal layer is arranged on the gate insulating layer and comprises a second common electrode line, and the second common electrode line is connected to the first common electrode line through the first via hole.

18. The array substrate according to claim 17, wherein an interlayer insulating layer is formed on the source/drain metal layer, and a second via hole is formed in the interlayer insulating layer; and the at least two metal layers further comprise a pixel electrode layer, the pixel electrode layer is arranged on the interlayer insulating layer and comprises a third common electrode line, and the third common electrode line is connected to the second common electrode line through the second via hole.

19. The array substrate according to claim 18, wherein the gate metal layer further comprises a gate line and a gate electrode, the gate electrode is connected to the gate line, and the gate line and the gate electrode are not in contact with the first common electrode line;

the source/drain metal layer further comprises a source electrode, a drain electrode and a data line, the source electrode is not in contact with the drain electrode, the source electrode is connected to the data line, and the data line is not in contact with the second common electrode line; and the pixel electrode layer further comprises pixel electrodes, and the pixel electrodes are not in contact with the third common electrode line.

20. The array substrate according to claim 18, wherein there is an overlapped region between an orthographic projection of the second via hole on the base and an orthographic projection of the first via hole on the base.

* * * * *